United States Patent
Perry et al.

(10) Patent No.: US 6,548,323 B1
(45) Date of Patent: Apr. 15, 2003

(54) METHOD OF PREPARING LIGHT-SENSITIVE INTEGRATED CIRCUITS FOR PACKAGING

(75) Inventors: Jeffrey R. Perry, Cupertino, CA (US); Michael E. Thomas, Milpitas, CA (US); Robert A. Sabsowitz, Santa Clara, CA (US); Reda R. Razouk, Sunnyvale, CA (US); Aaron G. Simmons, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/629,255

(22) Filed: Jul. 31, 2000

(51) Int. Cl.$^7$ ............................................... H01L 21/00
(52) U.S. Cl. ........................ 438/64; 438/114; 438/465
(58) Field of Search ........................... 438/106, 64, 65, 438/66, 67, 114, 116, 68, 113, 465

(56) References Cited

U.S. PATENT DOCUMENTS 6,157,019 A * 12/2000 Hosier ..................... 250/208.1
2002/0050591 A1 * 5/2002 Tandy ....................... 257/148

* cited by examiner

Primary Examiner—Tuan H. Nguyen
(74) Attorney, Agent, or Firm—Stallman & Pollock LLP

(57) ABSTRACT

A process for preparing a light-sensitive integrated circuit (IC) for packaging that provides a reduced exposure of the light-sensitive IC to light. The process includes providing a semiconductor substrate (e.g., a silicon wafer) with a plurality of light-sensitive ICs formed in/on its upper surface. The lower surface is optionally coated with opaque material. Next, the semiconductor substrate is diced to form individual light-sensitive ICs, each of which has a semiconductor substrate lower surface and semiconductor substrate lateral edges. The semiconductor substrate lateral edges (and optionally backside) are then spray coated with an opaque material (e.g., opaque ink) to form an opaque layer covering the semiconductor substrate lateral edges. The opaque layer prevents light from entering the semiconductor substrate through the lateral edges and interfering with the operation of the light-sensitive IC. The inventive process is simple and inexpensive, employing, for example, piezoelectric injectors to spray coat opaque ink on the semiconductor substrate lateral edges as the individual ICs are conveyed through a pass-through. In addition, processes according to the present invention are independent of the techniques used to manufacture the light-sensitive ICs and, therefore, provide for increased packaging process flexibility and economy.

29 Claims, 2 Drawing Sheets

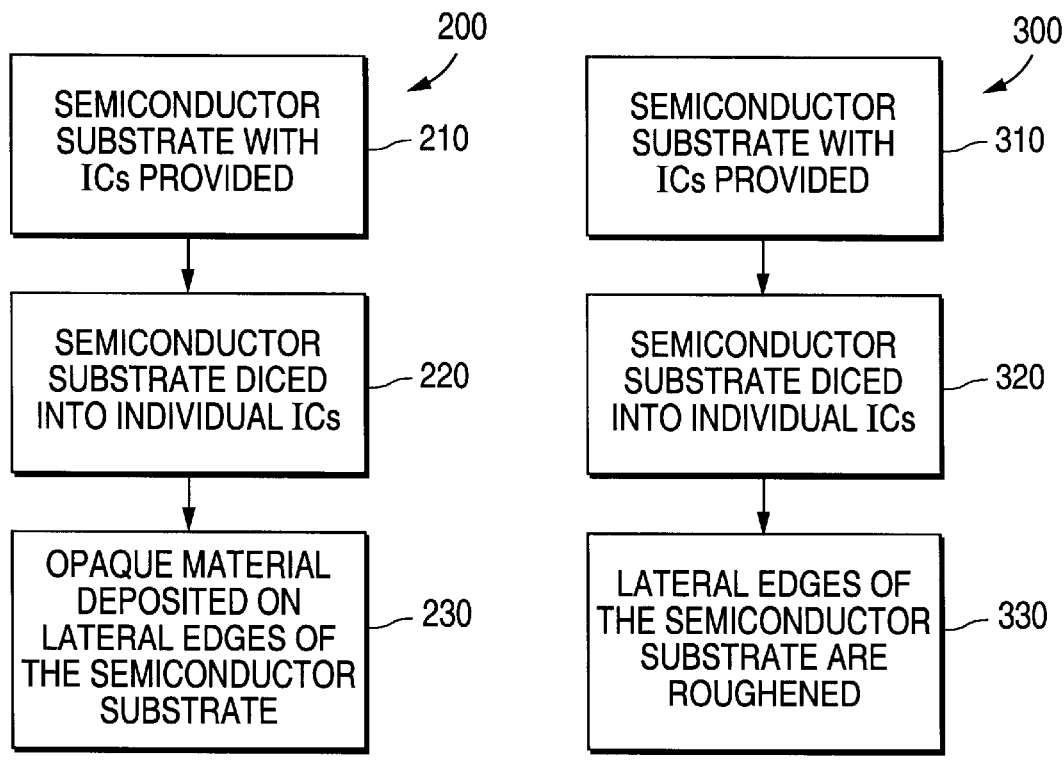
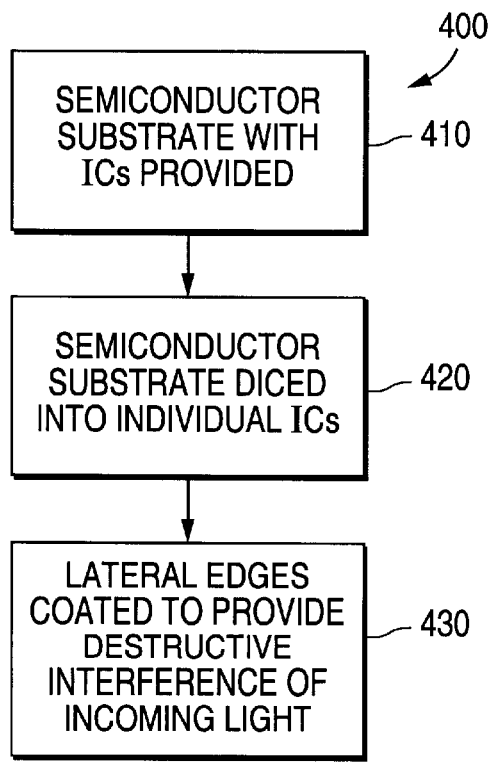

METHOD OF PREPARING LIGHT-SENSITIVE INTEGRATED CIRCUITS FOR PACKAGING

BACKGROUND OF THE INVENTION

1. Field of the Invention

The present invention relates to integrated circuit packaging methods and, in particular, to packaging methods for light-sensitive integrated circuits.

2. Description of the Related Art

Traditional integrated circuit packages and packaging methods provided for an integrated circuit (also known as a "chip" or "die") to be connected to an external system and protected from deleterious environmental factors, such as moisture. In order to provide an integrated circuit (IC) package of minimum size, it can be desirable to essentially utilize the IC's semiconductor substrate (e.g., a silicon wafer) as a portion of the package. For example, in chip scale package (CSP) packaging processes, bond pads (for the provision of input signals, output signals, supply voltage and ground) on an IC's upper surface are directly connected to bond pads on a printed circuit board [PCB] via solder bumps. During such a CSP packaging process, an IC with attached solder bumps is flipped over and aligned with package bond pads. The solder bumps are then subjected to reflow processing in order to attach the IC's bond pads to the PCB bond pads. In this scenario, the semiconductor substrate, on which the IC was formed, can remain exposed and be used as a portion of a completed IC package.

A drawback of CSP packages and packaging processes, and other packages and packaging processes that do not completely enclose the IC with opaque materials, is that the IC remains exposed to various light sources, such as incandescent light sources and the sun. For example, a PCB containing a CSP packaged IC may be placed in a non-opaque housing to create an esthetically pleasing design for cell phones and other consumer products. These designs, however, expose the IC to light. For light-sensitive ICs, such exposure can lead to interference with the operation of the light-sensitive IC, including unwelcome electrical currents/voltages, performance degradation, malfunction or shutdown.

Opaque layers can be applied to the upper and lower surfaces of multiple ICs formed in and on a semiconductor substrate (i.e., ICs in wafer form) during their manufacture. However, prior to packaging, ICs in wafer form are diced (for example, by being sawn) into individual ICs. The dicing process exposes lateral edges of the semiconductor substrates through which an IC can be exposed to light.

Still needed in the field, therefore, is a simple and inexpensive process for preparing light-sensitive integrated circuits for packaging that provides for a reduced exposure of the integrated circuit to light, particularly on the lateral edges of the IC which are exposed after dicing.

SUMMARY OF THE INVENTION

The present invention provides a process for preparing a light-sensitive integrated circuit for packaging that provides a reduced exposure of the integrated circuit-to light. This reduced exposure to light is accomplished by forming a layer of opaque material, such as a layer of opaque ink, on the semiconductor substrate lateral edges of an individual integrated circuit. Processes in accordance with the present invention are simple and inexpensive, and employ, for example, piezoelectric injectors to spray coat opaque ink on the semiconductor substrate lateral edges. In addition, since processes according to the present invention are independent of the techniques used to manufacture the light-sensitive integrated circuits, they provide for an increase in packaging process flexibility and economy.

Processes in accordance with the present invention include first providing a semiconductor substrate (e.g., a silicon wafer) with a plurality of light-sensitive integrated circuits (ICs) formed in and on its upper surface. The semiconductor substrate is subsequently diced to form individual light-sensitive ICs, each of which has a semiconductor substrate lower surface and semiconductor substrate lateral edges. Next, the semiconductor substrate lateral edges are spray coated with an opaque material (e.g., opaque ink) to form an opaque layer covering the semiconductor substrate lateral edges. The opaque layer prevents light from entering the semiconductor substrate through the lateral edges and thereafter interfering with the operation of the light-sensitive IC.

Other processes in accordance with the present invention include first providing a semiconductor substrate with a plurality of light-sensitive ICs formed in and on its upper surface. Next, the semiconductor substrate is diced to form individual light-sensitive ICs, each of which has a semiconductor substrate lower surface and semiconductor substrate lateral edges. An opaque material (e.g., a metal or polymer) is then deposited on the semiconductor substrate lateral edges to form a deposited opaque layer. The deposited opaque layer prevents light from entering the semiconductor substrate through the lateral edges and thereafter interfering with the operation of the light-sensitive integrated IC.

Yet other processes in accordance with the present invention include first providing a semiconductor substrate with a plurality of light-sensitive ICs formed in and on its upper surface. Next, the semiconductor substrate is diced to form individual light-sensitive ICs, each of which has a semiconductor substrate lower surface and semiconductor substrate lateral edges. The semiconductor substrate lateral edges are subsequently roughened to form roughened lateral edges that reflect incoming light (i.e., light impinging upon the semiconductor substrate lateral edges) in a manner that creates destructive interference of the incoming light, thereby preventing light from entering the semiconductor substrate.

Still other processes in accordance with the present invention include first providing a semiconductor substrate with a plurality of light-sensitive ICs formed in and on its upper surface. Next, the semiconductor substrate is diced to form individual light-sensitive ICs, each of which has a semiconductor substrate lower surface and semiconductor substrate lateral edges. The semiconductor substrate lateral edges are subsequently coated with a material to form a material layer with a thickness that provides for destructive interference of incoming light and, thereby, prevents light from entering the semiconductor substrate.

The above processes may also be used to coat the back of the IC with opaque material, in addition to the lateral edges, if desired. This can eliminate the need for a separate backside coating step.

BRIEF DESCRIPTION OF THE DRAWINGS

A better understanding of the features and advantages of the present invention will be obtained by reference to the following detailed description that sets forth illustrative embodiments, in which the principles of the invention are utilized, and the accompanying drawings, of which:

FIG. 3 is a flow diagram of another process in accordance with the present invention.

FIG. 4 is a flow diagram of yet another process in accordance with the present invention.

FIG. 5 is a flow diagram of still another process in accordance with the present invention.

DETAILED DESCRIPTION OF THE INVENTION

Figure 1:
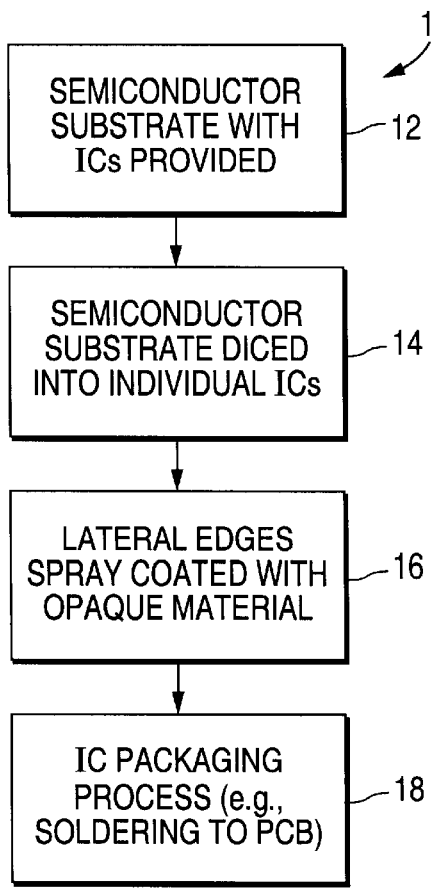
FIG. 1 is a flow diagram of a process in accordance with the present invention.

FIG. 1 is a flow diagram outlining the steps in a process 10 in accordance with the present invention for preparing a light-sensitive integrated circuit for packaging. First, at step 12, a semiconductor substrate with a plurality of light-sensitive integrated circuits (ICs) formed in and on an upper surface of the semiconductor substrate is provided. The semiconductor substrate is typically a silicon (Si) substrate in wafer form, although other semiconductor substrates known in the field can be employed in practicing the invention. The light-sensitive IC can be any light-sensitive IC known in the field, including CMOS, Bipolar and BiCMOS light-sensitive ICs. The backside of the semiconductor substrate may be coated with opaque material at this point. Next, at step 14, the semiconductor substrate is diced into individual light-sensitive ICs. The semiconductor substrate can be diced, for example, using conventional sawing techniques. Each of the individual light-sensitive ICs created in step 14 has a semiconductor substrate lower surface and semiconductor substrate lateral edges. The semiconductor substrate lateral edges of the light-sensitive ICs have a height (i.e., the distance from the semiconductor substrate upper surface to the semiconductor substrate lower surface), for example, of approximately 750 microns. Then, in step 16, the semiconductor substrate lateral edges are spray coated with an opaque material (i.e., a material that is impenetrable by light of wavelengths that are capable of interfering with the operation of the light-sensitive IC). The spray coated opaque material forms an opaque layer covering the semiconductor substrate lateral edges. Alternatively, both the semiconductor substrate lateral edges and semiconductor substrate lower surface can be spray coated with an opaque material.

The thickness of the opaque layer is sufficient to block essentially all of the light of wavelengths that can interfere with operation of the light-sensitive IC (e.g., visible light, light of infra-red wavelengths or ultra-violet light) from entering the semiconductor substrate. The thickness will, therefore, depend on the light blocking characteristics of the opaque layer for the light wavelength(s) of interest.

In one embodiment, the opaque material is an opaque ink (e.g., an opaque ink capable of withstanding the high temperatures encountered in IC packaging processes) and the opaque ink is spray coated on the semiconductor substrate lateral edges using piezoelectric ink injectors to form an opaque ink layer. The opaque ink layer can be dried, for example, through the application of heat or by exposure to room temperature air.

In another embodiment, the opaque material is spray coated on the semiconductor substrate lateral edges as the individual light-sensitive ICs are conveyed through a pass-through, around which are arrayed piezoelectric injectors designed for spray coating the opaque material.

Next, at step 18, the individual light-sensitive IC can be placed onto a substrate, such as a printed circuit board, to undergo a packaging process. For example, individual light-sensitive ICs which have been spray-coated in step 16 can be placed immediately on a PCB and then soldered to that PCB. This example illustrates how processes according to the present invention can be easily integrated (i.e., combined) with conventional packaging processes.

Figure 2:
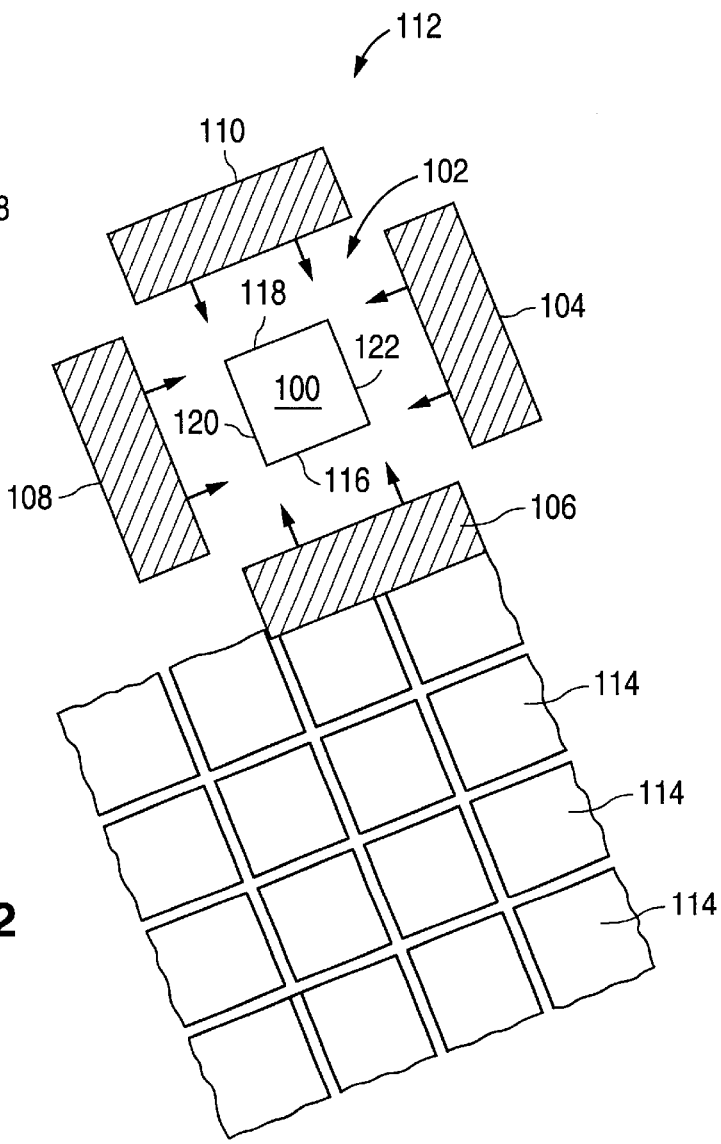
FIG. 2 is a perspective schematic drawing of a stage in a process in accordance with the present invention.

FIG. 2 is a perspective schematic drawing illustrating a spray-coating step in a process in accordance with the present invention. FIG. 2 shows an individual light-sensitive IC 100 being conveyed through a pass-through 102 (i.e., an opening or passageway through which an individual light-sensitive IC can be conveyed), about which are arrayed four piezoelectric injectors 104, 106, 108 and 110. In this embodiment, the individual light-sensitive IC is being conveyed by an extraction mechanism 112 (e.g., a commercially available IC pick-and-place apparatus). FIG. 2 depicts a situation where the individual light-sensitive IC 100 has been removed from amongst a plurality of light-sensitive ICs 114 (that were previously formed by dicing a semiconductor substrate) by extraction mechanism 112. Piezoelectric-injectors 104, 106, 108 and 110 are employed to spray coat the semiconductor substrate lateral edges 116, 118, 120 and 122 of individual light-sensitive IC 100 with an opaque ink as it is conveyed through the pass-through 102. In FIG. 2, arrows indicate the direction of travel for the opaque ink as it exits the piezoelectric injectors 104, 106, 108 and 110.

Once apprised of the present disclosure, those of ordinary skill in the art can easily optimize various parameters associated with the piezoelectric injectors and pass-through to insure that the semiconductor substrate lateral edges are spray coated sufficiently to block penetration of light into the semiconductor substrate. The following parameters can, for example, be optimized: (i) the conveyance speed of the individual ICs through the pass-through (and, therefore, past the piezoelectric injectors); (ii) the dimensions of the pass-through; (iii) the distance from the semiconductor substrate lateral edges to the piezoelectric injectors; and (iv) the opaque ink flow rate, velocity and pressure. In this regard, it is noted that the optimal distance between the semiconductor substrate lateral edges and the piezoelectric injectors depends on (a) the accuracy of the extraction mechanism conveying the individual light-sensitive IC through the pass through, (b) the maximum distance across which the piezoelectric injectors can spray coat the opaque ink, and (c) the leeway to avoid overspray of the opaque material onto surfaces other than the semiconductor substrate lateral edges (and, if desired, the semiconductor substrate lower surface). A typical distance would be, however, in the range of 1 mm to 5 mm.

It is envisioned that the spray coating step can be controlled by an optical sensor (not shown) that detects the presence of a semiconductor substrate lateral edge as an individual light-sensitive IC is conveyed through a pass through. The spray coating step can also be controlled, for example, by a programmable controller (e.g., a computer) that minimizes uses of the opaque material and overspray. Furthermore, the location of the piezoelectric injectors can be adjusted to accommodate light-sensitive ICs of various sizes, thereby creating an adjustable size pass through. Angled piezoelectric injectors can also be employed to facilitate spray coating of a semiconductor substrate bottom surface.

FIG. 3 is a flow diagram outlining the steps in another process 200 in accordance with the present invention for preparing a light-sensitive IC for packaging. First, at step 210, a semiconductor substrate with a plurality of light-sensitive ICs formed in and on an upper surface of the semiconductor substrate is provided. As in the aforementioned embodiment, the semiconductor substrate is typically a silicon (Si) substrate in wafer form, although other semiconductor substrates known in the field can be employed in practicing the invention. Backside may be coated with opaque material. Next, at step 220, the semiconductor substrate is diced into individual light-sensitive ICs. The semiconductor substrate can be diced using conventional sawing techniques. Each of the individual light-sensitive ICs created in step 220 has both a semiconductor substrate lower surface and semiconductor substrate lateral edges. Then, in step 230, an opaque material is deposited on the semiconductor substrate lateral edges to form a deposited opaque material layer covering the semiconductor substrate lateral edges. The opaque material can be, for example, a metal that is commonly used for other purposes in the semiconductor industry, such as aluminum (Al), titanium (Ti), titanium-nitride (TiN), cobalt (Co), tungsten (W) or combinations thereof, or a polymer. The opaque material can be deposited on the semiconductor substrate lateral edges using, for example, chemical vapor deposition (CVD) techniques or sputtering techniques in conjunction with conventional equipment (e.g., equipment where individual light-sensitive ICs are conveyed through a deposition chamber on a belt). The material would also be typically deposited on the backside of the silicon substrate.

The thickness of the deposited opaque material layer will depend on the opaque material used to form the layer and the wavelength of light to be blocked. However, for a TiN deposited opaque layer the thickness should typically be, for example, at least 1500 angstroms, while a deposited opaque layer of tungsten should typically be greater than 500 angstroms. A deposited opaque layer formed of titanium should typically have a thickness in the range of 300 angstroms and greater.

FIG. 4 is a flow diagram outlining the steps in yet another process 300 in accordance with the present invention for preparing a light-sensitive IC for packaging. First, at step 310, a semiconductor substrate with a plurality of light-sensitive ICs formed in and on an upper surface of the semiconductor substrate is provided. The semiconductor substrate is usually a silicon (Si) substrate in wafer form, although other semiconductor substrates known in the field can be employed in practicing the invention. Backside may be coated with opaque material, which is resistant to etching. Next, at step 320, the semiconductor substrate is diced into individual light-sensitive ICs. The semiconductor substrate can be diced using, for example, conventional sawing techniques. Each of the individual light-sensitive ICs created in step 320 has both a semiconductor substrate lower surface and semiconductor substrate lateral edges. Then, in step 330, the semiconductor surface lateral edges substrate are roughened (i.e., the surface of the semiconductor surface lateral edges are textured) to form roughened lateral edges that reflect incoming light in a manner that minimizes the light reaching the top, light-sensitive surface of the IC. This makes less light available to cause interference with the operation of the light-sensitive IC.

Roughening of the semiconductor substrate lateral edges can be accomplished using plasma etching (for example, using chlorine or $SF_6$ based plasmas), wet chemical etching (e.g., KOH or nitric acid) or vapor etching. Roughening of the backside of the wafer may be eliminated, if the previously coated material on the backside is resistant to etch.

FIG. 5 is a flow diagram outlining the steps in yet another process 400 in accordance with the present invention for preparing a light-sensitive IC for packaging. First, at step 410, a semiconductor substrate with a plurality of light-sensitive ICs formed in and on an upper surface of the semiconductor substrate is provided. Although a silicon (Si) substrate in wafer form is typically used as a semiconductor substrate, other semiconductor substrates known in the field can be employed in practicing the invention. Backside may be coated with opaque material. Next, at step 420, the semiconductor substrate is diced into individual light-sensitive ICs. The semiconductor substrate can be diced using conventional sawing techniques. Each of the individual light-sensitive ICs created in step 320 has both a semiconductor substrate lower surface and semiconductor substrate lateral edges. Then, in step 430, the semiconductor substrate lateral edges are coated with a material to form a material layer of a thickness that provides for destructive interference of incoming light and, thereby, prevents light from entering the semiconductor substrate. If desired, the semiconductor substrate lower surface can also be coated, thus eliminating the previous backside coating process. The material used to form the material layer can be, for example, titanium nitride (TiN), silicon nitride (Si3N4), silicon oxynitride (SixOyNz), or combinations thereof. A typical thickness for the material layer is in the range of 50 angstroms to 10,000 angstroms. This material may be applied using conventional techniques, such as chemical vapor deposition (CVD), low pressure chemical vapor deposition (LPCVD), atmospheric pressure chemical vapor deposition (APCVD) or sputtering.

It should be understood that various alternatives to the embodiments of the invention described herein may be employed in practicing the invention. It is intended that the following claims define the scope of the invention and that methods within the scope of these claims and their equivalents be covered thereby.

What is claimed is:

1. A method for preparing light-sensitive integrated circuits for packaging, the method comprising the steps of:

providing a semiconductor substrate with a plurality of light-sensitive integrated circuits formed in and on an upper surface of the semiconductor substrate;

dicing the semiconductor substrate into individual light-sensitive integrated circuits, each of the individual light-sensitive integrated circuits having a semiconductor substrate lower surface and semiconductor substrate lateral edges; and spray coating the semiconductor substrate lateral edges with an opaque material to form an opaque layer covering the semiconductor substrate lateral edges.

2. The method of claim 1, wherein the spray coating step also includes spray coating the semiconductor substrate lower surface with an opaque material to form an opaque layer covering the semiconductor substrate lower surface.

3. The method of claim 1, wherein the spray coating step utilizes an opaque ink to form an opaque ink layer covering the semiconductor substrate lateral edges.

4. The method of claim 1, wherein the spray coating step is conducted as the individual light-sensitive integrated circuits are conveyed through a pass-through.

5. The method of claim 4, wherein the spray coating step includes conveying the individual light-sensitive integrated circuits with a pick-and-place apparatus.

6. The method of claim 5, wherein the spray coating step includes conveying the individual light-sensitive integrated circuits through a pass-through that is integrated with the pick-and-place tool.

7. The method of claim 4, wherein the spray coating step is controlled by an optical sensor that detects the presence of a semiconductor substrate lateral edge as the light-sensitive integrated circuit is moved through the passthrough.

8. The method of claim 4, wherein the spray coating step is conducted as the individual light-sensitive integrated circuits are conveyed through an adjustable size pass through.

9. The method of claim 1, wherein the spray coating step utilizes piezoelectric injectors for the spray coating.

10. The method of claim 9 further including, following the spray coating step, a step of placing the individual light-sensitive integrated circuit onto a printed circuit board.

11. The method of claim 1, wherein the spray coating step is conducted as the individual light-sensitive intergrated circuits are conveyed through a pass-through and the spray coating step utilizes piezoelectric injectors arrayed around a pass-through for spray coating.

12. The method of claim 1 further including the step of:
coating the backside with opaque material, after the providing step and before the dicing step.

13. A method for preparing light-sensitive integrated circuits for packaging, the method comprising the steps of:
providing a semiconductor substrate with a plurality of light-sensitive integrated circuits formed in and on an upper surface of the semiconductor substrate;
dicing the semiconductor substrate into individual light-sensitive integrated circuits, each of the individual light-sensitive integrated circuits having a semiconductor substrate lower surface and semiconductor substrate lateral edges; and
spray coating the semiconductor substrate lateral edges with an opaque ink to form an opaque layer covering the semiconductor substrate lateral edges,
wherein the spray coating step is conducted as the individual light-sensitive integrated circuits are conveyed through a pass-through and wherein the spray coating step utilizes piezoelectric injectors arrayed around the pass-through for spray coating.

14. The method of claim 13 further including the step of:
coating the backside with opaque material, after the providing step and before the dicing step.

15. The method of claim 13, wherein the spray coating step also spray coats the backside with an opaque ink.

16. A method for preparing light-sensitive integrated circuits for packaging, the method comprising the steps of:
providing a semiconductor substrate with a plurality of light-sensitive integrated circuits formed in and on an upper surface of the semiconductor substrate;
dicing the semiconductor substrate into individual light-sensitive integrated circuits, each of the individual light-sensitive integrated circuits having a semiconductor substrate lower surface and semiconductor substrate lateral edges; and
depositing an opaque material on the semiconductor substrate lateral edges to form a deposited opaque layer covering the semiconductor substrate lateral edges.

17. The method of claim 16 further including the step of:
coating the backside with opaque material, after the providing step and before the dicing step.

18. The method of claim 16, wherein the depositing step also deposits the opaque material on the backside.

19. The method of claim 16, wherein the depositing step utilizes an opaque material selected from the opaque material group consisting of opaque metals and opaque polymers.

20. The method of claim 16, wherein the depositing step is conducted using a chemical vapor deposition technique.

21. The method of claim 16, wherein the depositing step is conducted using a sputter deposition technique.

22. A method for preparing light-sensitive integrated circuits for packaging, the method comprising the steps of:
providing a semiconductor substrate with a plurality of light-sensitive integrated circuits formed in and on an upper surface of the semiconductor substrate;
dicing the semiconductor substrate into individual light-sensitive integrated circuits, each of the individual light-sensitive integrated circuits having a semiconductor substrate lower surface and semiconductor substrate lateral edges; and
roughening the semiconductor substrate lateral edges to form roughened lateral edges that reflect incoming light in a manner that minimizes the light reaching the top, light-sensitive surface of the IC.

23. The method of claim 22 further including the step of:
coating the backside with opaque material which is resistant to etching, after the providing step and before the dicing step.

24. The method of claim 22, wherein the roughening step is conducted using a plasma etching technique.

25. The method of claim 22, wherein the roughening step is conducted using a wet chemical etching technique.

26. A method for preparing light-sensitive integrated circuits for packaging, the method comprising the steps of:
providing a semiconductor substrate with a plurality of light-sensitive integrated circuits formed in and on an upper surface of the semiconductor substrate;
dicing the semiconductor substrate into individual light-sensitive integrated circuits, each of the individual light-sensitive integrated circuits having a semiconductor substrate lower surface and semiconductor substrate lateral edges; and
coating the semiconductor substrate lateral edges with a material to form a material layer of a thickness that provides for destructive interference of incoming light and, thereby, prevents light from entering the semiconductor substrate.

27. The method of claim 26, wherein the coating step includes coating the semiconductor substrate with a material selected from the group consisting of titanium nitride, silicon nitride, and silicon oxynitride.

28. The method of claim 26 further including the step of:
coating the backside with opaque material, after the providing step and before the dicing step.

29. The method of claim 26, wherein the coating step also coats the backside of the substrate with the material.

* * * * *